United States Patent [19]

Sahara et al.

[11] 3,714,543

[45] Jan. 30, 1973

[54] CONSTANT CURRENT CIRCUIT CONSTITUTED ON A MONOLITHIC IC

[75] Inventors: Masayoshi Sahara; Yasuhiro Nanba, both of Sakai, Japan

[73] Assignee: Minolta Camera Kabushiki Kaisha, Osaka, Japan

[22] Filed: Nov. 22, 1971

[21] Appl. No.: 200,691

[30] Foreign Application Priority Data

Nov. 21, 1970 Japan ..............................45/116287

[52] U.S. Cl. ......................323/4, 307/270, 307/313, 307/297, 323/9

[51] Int. Cl. ..............................G05f 1/06, H02j 1/04

[58] Field of Search .....323/4, 9, 22 T; 307/303, 313, 307/270, 296, 297; 330/17, 34

[56] References Cited

UNITED STATES PATENTS

| | | | |
|---|---|---|---|
| 3,588,672 | 6/1971 | Wilson | 323/4 |
| 3,544,882 | 12/1970 | Tanaka | 323/4 |
| 3,549,910 | 12/1970 | Ogawa | 307/270 |
| 3,588,550 | 6/1971 | Matsuda | 307/313 |
| 3,624,426 | 11/1971 | Saari | 307/297 |

*Primary Examiner*—Gerald Goldberg
*Attorney*—Craig, Antonelli and Hill

[57] ABSTRACT

A constant current transistor circuit employs a pair of PNP transistors disposed adjacent to each other on a single monolithic integrated circuit. Also included are a pair of NPN transistors disposed adjacent to each other on the same monolithic integrated circuit, with respective ones of the PNP transistors and the NPN transistors being connected to each other to form first and second combined transistor circuits. In each of the combined transistor circuits, the emitter of the PNP transistor is connected to the collector of the NPN transistor, while the collector of the PNP transistor is connected to the base of the NPN transistor, the respective bases of each PNP transistor also being connected directly to each other. Also provided is a third NPN transistor to provide constant current, the collector of which is connected to the emitter of the NPN transistor of one of the combined transistor circuits, while a diode is connected between the connected bases of the PNP transistors of the two combined transistor circuits and the collector of the third NPN transistor, while a DC power source is connected in series with a load and is provided across the third NPN transistor and said combined transistor circuits.

15 Claims, 5 Drawing Figures

CONSTANT CURRENT CIRCUIT CONSTITUTED ON A MONOLITHIC IC

BACKGROUND OF THE INVENTION

This invention relates to a constant-current circuit which is constituted on a monolithic integrated circuit (hereinafter mentioned as IC).

In general, a $V_{BE}$ vs. log $I_C$ characteristic curve, i.e., the relationship between the base-to-emitter voltage and the logarithm of collector current of a PNP transistor formed as a part of a monolithic IC, has less linearity, as indicated by a solid curve shown in FIG. 1, in comparison with the corresponding characteristic curve of an NPN transistor formed as a part of the monolithic IC indicated by a dotted line in FIG. 1.

In an ordinary transistor or an NPN transistor formed in a part of a monolithic IC, for considerably wide range of $V_{BE}$, $$V_{BE} = V_O \cdot \log I_C + V_1 \qquad (1)$$

where $V_0$ and $V_1$ are constants. However, for a PNP transistor constituted on a monolithic IC, $V_0$ in the equation (1) is not constant for a range where the $V_{BE}$ is extraordinarily large or for a range where the $V_{BE}$ is extraordinarily small. Also, the $V_O$ is not same for each of the PNP transistors. Moreover, the current gain ($\beta$) of the PNP transistor constituted on a monolithic IC is small and can be less than one tenth of that of the NPN transistors constituted on the same IC, namely, only about 2 to 5. Accordingly, hitherto it has been considered impossible to obtain a constant-current circuit will an output current of more than 5 $\mu$A by employing only PNP transistors on a monolithic IC.

In order to attain an improved result, there has been conventionally proposed a constant-current circuit comprising a pair of transistors constituted on one monolithic IC such as shown in a circuit diagram of FIG. 2, wherein a conventional PNP transistor $T_1'$ and a conventional NPN transistor $T_2'$, both constituted on a monolithic IC, are connected to each other so as to form a composition $T_{12}'$ of transistors $T_1'$ and $T_2'$ which works equivalently to a PNP transistor with apparent satisfactory current gain (i.e., virtual current gain) for virtual $V_{BE}$ and virtual $I_C$ . In such a composite equivalent transistor $T_{12}'$, although a virtual $V_{BE}$ vs. log $I_C$ curve for a range of a large virtual $V_{BE}$ is considerably linear, and even if the voltage $V_{BE}$ is compensated against temperature dependency by employing, for instance, as a conventional compensation element, a diode in place of the resistor $r_2$, stability of the circuit with respect to temperature change is very poor, since temperature dependency of current gain of these transistors differs from each other.

SUMMARY OF THE INVENTION

This invention purports to obtain a constant-current circuit constituted on a monolithic IC which circuit has a less temperature-dependent and constant-current characteristic.

DETAILED DESCRIPTION OF THE INVENTION

Figure 3:
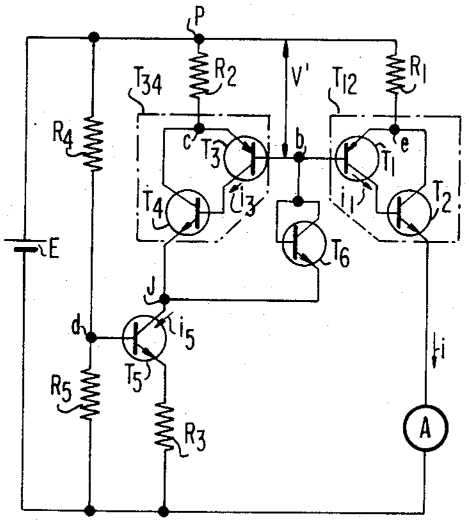
FIGS. 3 to 5 are circuit diagrams of examples of constant-current circuits embodying the present invention, respectively.

In FIG. 3, a pair of PNP transistors $T_1$ and $T_3$, and a pair of NPN transistors $T_2$ and $T_4$ are constituted on a single monolithic IC in such a manner that said transistors $T_1$ and $T_3$ as well as said transistors $T_2$ and $T_4$, respectively, are located close adjacent to each other on one monolithic semiconductor substrate. Of these four transistors, $T_1$ and $T_2$ as well as $T_3$ and $T_4$, are connected so as to compose compositions ($T_{12}$ and $T_{34}$), each consisting of two transistors and behaving like a PNP transistor of high current gain, in each of which compositions the collectors of the PNP transistors ($T_1$ and $T_3$) are connected to the bases of the NPN transistors ($T_2$ and $T_4$), respectively, and the emitters of the PNP transistors ($T_1$ and $T_3$) are connected to the collectors of the NPN transistors ($T_2$ and $T_4$). Thus, compositions $T_{12}$ and $T_{34}$ are formed so as to behave apparently as ordinary PNP transistors having an ordinary $V_{BE}$ vs. log $I_C$ characteristic, respectively.

The bases of the transistors $T_1$ and $T_3$ are connected to each other. Both collectors of the transistors $T_2$ and $T_4$ are connected to the positive end of the D.C. power source E through the resistors $R_1$ and $R_2$, having resistances $R_1$ and $R_2$, respectively.

A load A which requires the feeding of a constant-current $i$ is connected between the emitter of the transistor $T_2$ and the negative end of the power source E. The emitter of the transistor $T_4$ is connected to the collector of an NPN Transistor $T_5$ which is for obtaining a constant-current function and is constituted on said monolithic IC, and the emitter of the transistor $T_5$ is connected to the negative end of the power source E through the resistor $R_3$.

Namely, the power source E feeds the series connection of the composition $T_{12}$ and the load A, as well as the series connection of the composition $T_{34}$ and the transistor $T_5$.

A forward diode $T_6$ is for permitting very small current, for instance, under 1 micro-ampere, to flow therethrough, from the bases of the transistors $T_1$ and $T_3$, and is connected between a junction point $b$ and a junction point J. The junction point $b$ is between the bases of transistors $T_1$ and $T_3$, and the junction point J is between the emitter of the transistor $T_4$ and the collector of the transistor $T_5$.

The diode $T_6$ is preferably constituted by connecting the base and the collector of a transistor on said monolithic IC. The base of the transistor $T_5$ is connected to the junction point $d$ of a dividing network consisting of series-resistors $R_4$ and $R_5$ which are connected across both ends of the power source E. All the transistors $T_1$ to $T_6$ is preferably constituted on a single monolithic IC.

In the above-mentioned circuit, the collector current $i_5$ of the transistor $T_5$ is made constant being regulated by the voltage of the point $d$. Since the base currents of the transistors $T_1$ and $T_3$ are negligibly small as compared to the collector current of transistor $T_5$, the load current $i$ and the collector current $i_5$ can be regarded as the currents of the resistors $R_1$ and $R_2$, respectively.

As is known, the collector current $i_3$ of the transistor $T_3$ is given as:

$i_3 = i_5/(1 + \beta_4)$, wherein $\beta_4$ is the current gain of the transistor $T_4$.

By defining the constant current flowing through the emitter of the transistor $T_2$ as $i$, the collector current $i_1$ of the transistor $T_1$ is given as:

$i_1 = i/(1 + \beta_2)$, wherein $\beta_2$ is the current gain of the NPN transistor $T_2$.

Accordingly, a voltage V′ between the positive end P of the power source E and the point $b$ is given as follows alike the equation (1), $$V' = R_2 \cdot i_5 + V_0 \cdot \log i_3 + V_1 \quad (2.1)$$
$$V' = R_1 \cdot i + V_0 \cdot \log i_1 + V_1 \quad (2.2)$$

By substituting the aforementioned $i_3$ and $i_1$ for the $i_3$ and $i_1$ in these equations (2.1) and (2.2), $$V' = R_2 \cdot i_5 + V \cdot \log [i_5/(1 + \beta_4)] + V_1 \quad (2.3)$$
$$V' = R_1 \cdot i + V_0 \cdot \log [i/(1 + \beta_2)] + V_1 \quad (2.4)$$

Since transistors $T_2$ and $T_4$ are disposed close to each other on the same monolithic IC, the current gains $\beta_2$ and $\beta_4$ can be regarded equal, and accordingly, the following relation is obtainable from the equations (2.3) and (2.4):

$$R_2 \cdot i_5 + V_0 \cdot \log i_5 = R_1 \cdot i + V_0 \cdot \log i \quad (3)$$

In case the difference between $i_5$ and $i$ is small, then $V_0 \cdot \log i_5 = V_0 \cdot \log i$.

Accordingly, equation (3) can be represented as:

$$i = (R_2/R_1) \cdot i_5 \quad (4)$$

As is obvious from equation (4), the regulated constant current is given without the factor $V_0$, which is dependent on temperature as has been stated concerning the equation (1). This reveals that the regulated load current $i$ is constant and independent of temperature change.

One practical example of operation of the circuit of FIG. 3 is as follows:

| | |
|---|---|
| Voltage of the lower source E | 3 V |
| $R_1$, $R_2$ | 10 KΩ |
| $R_3$ | 1 KΩ |
| $R_4$ | 25 KΩ |
| $R_5$ | 6 KΩ |
| Transistors $T_1$ to $T_6$ are constituted on one monolithic IC | |
| $i_5$ at 25°C | 50μA |

In the above listed operating condition, the regulated constant-current $i$ in the load A was 50 μA at 25°C, and the ratio $i/i_5$ changed only within ± 0.5 percent for the temperature change ranging between − 30°C to + 60°C. In case a diode is employed in place of the resistor $R_5$ in order to compensate for temperature dependency, the load current $i$ is satisfactorily stabilized.

Figure 1:
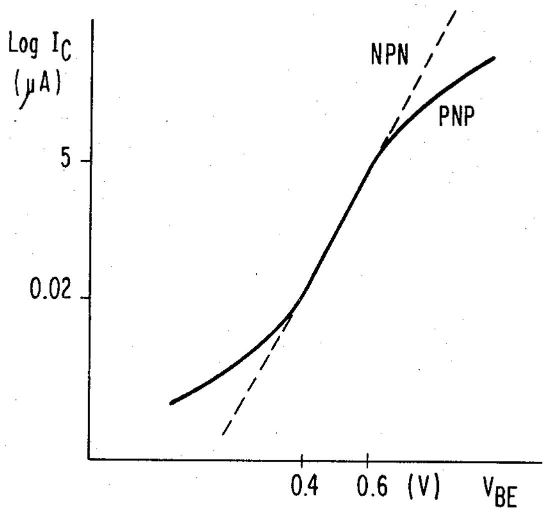
FIG. 1 is a graph indicating the relationship between the $V_{BE}$ vs. log $I_C$ curves for PNP and NPN transistors constituted on a monolithic IC.
Figure 2:
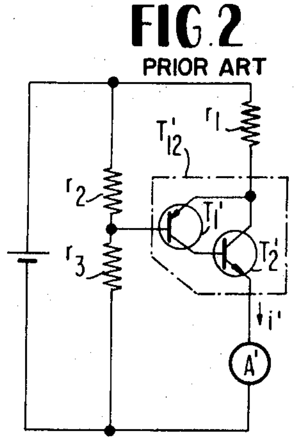
FIG.2 PRIOR ART
FIG. 2 is a circuit diagram of a conventional constant-current circuit comprising a pair of transistors constituted on a monolithic IC, and C

On the contrary, in the conventional circuit shown in FIG. 2, wherein $r_1$ = 1 KΩ, $r_2$ = 6 KΩ, $r_3$ = 25 KΩ, $i'$ = 50 μA at 25°C, the load current i′ changes 100 percent, namely from 0 μA at − 30°C to about 100 μ A at + 60°C. Even when a diode is used in place of the the resistor $r_2$ so as to compensate for the temperature dependency of $V_{BE}$, it was difficult to reduce the change of the load current $i'$ within ± 30 percent.

Figure 4:
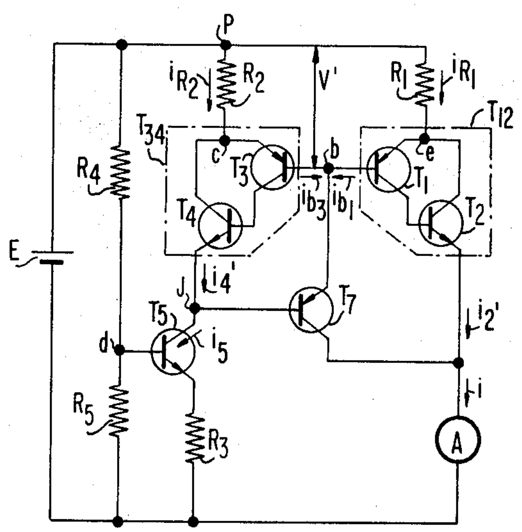

In FIG. 4, which represents a second example of the present invention, a third PNP transistor $T_7$ is provided in place of the transistor $T_6$ of FIG. 3. With respect to transistor $T_7$, its emitter is connected to the junction point $b$ between the bases of the PNP transistors $T_1$ and $T_3$, its base is connected to the collector of the transistor $T_5$, and its collector is connected to the emitter of the transistor $T_2$. Other parts of the circuit of FIG. 4 are constituted in the same way as that of FIG. 3.

A voltage V′ between the positive end P of the power source E and the point b is given as follows similar to equation (1).

$$V' = R_2 \cdot i_{R2} + V_{BE3} = R_2 \cdot (i_4' + i_{b3}) + V_{BE3} \quad (5.1)$$
$$V' = R_1 \cdot i_{R1} + V_{BE1} = R_1 \cdot (i_2' + i_{b1}) + V_{BE1} \quad (5.2),$$

Since $V_{BE1}$ and $V_{BE3}$ are substantially equal, $$i_2' = (R_2/R_1) \cdot i_4' + (R_2/R_1) \cdot i_{b3} - i_{b1} \quad (6),$$

wherein, $i_{R1}$, $i_{R2}$ are the currents of the resistors $R_1$, $R_2$, respectively, $V_{BE1}$ and $V_{BE3}$ are the base-emitter voltages of the transistors $T_1$ and $T_3$, respectively, $i_2'$, $i_4'$ are the currents of the emitters of the transistors $T_1$, $T_3$, respectively. Since the emitter-current of the transistor $T_7$, which current consists of the base-currents $i_{b1}$ and $i_{b2}$, is negligibly small, the transistor $T_7$ works with a current gain of about 1 or 2, and, accordingly, the base-current and the collector-current of the transistor $T_7$ become almost equal. If the resistors $R_1$ and $R_2$ are selected to be of equal resistance, the terms $$(R_2/R_1) \,.\, i_{b3} - i_{b1}$$

in equation (6) can be neglected. Consequently, from equation (6), $$i_2' = (R_2/R_1) \,.\, i_4' \quad (7)$$

On the other hand, since the currents of the base and the collector of the transistor $T_7$ are almost equal, $$i = i_2' + ½ ( i_{b1} + i_{b3} ) \quad (8.1)$$
$$i_5 = i_4' + ½ ( i_{b1} + i_{b3} ) \quad (8.2)$$

Since $R_1 = R_2$, from the afore-mentioned selection from the equations (8.1) and (8.2), $$i = i_5 \quad (9)$$

This reveals that load current $i$ is regulated to be equal to the regulated current $i_5$, irrespective of temperature changes.

Figure 5:
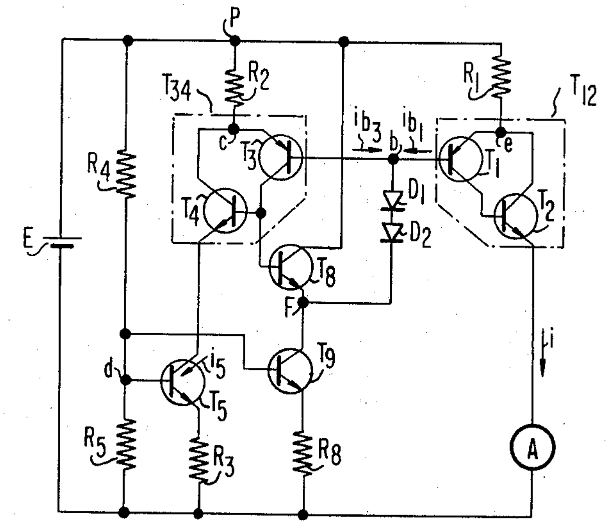

In Figure 5, which represents a third example of the present invention, a pair of tandem-connected NPN transistors $T_8$ and $T_9$ and an emitter resistor $R_8$ are connected in series across the power source E. The base of the transistor $T_9$ is connected to the base of the transistor $T_5$. The base of the transistor $T_8$ is connected to the base of the transistor $T_4$, and a pair of series connected diodes $D_1$,$D_2$ connects the connection point $b$ to the connection point F between emitter of the transistor $T_8$ and the collector of the transistor $T_9$. Other parts of the circuit of FIG. 5 are constituted in the same way as that of Figure 3.

In this circuit, the base currents of the transistors $T_1$ and $T_3$ flow through the diodes $D_1$ and $D_2$ and constitute the collector current of the transistor $T_9$ together with the emitter current of the transistor $T_8$. Since the transistor $T_8$ is an NPN type, its current gain is large and, consequently, its base current is negligibly small. Moreover, since the base currents of the transistors $T_1$ and $T_3$ flow only into the transistor $T_9$, these currents neither effect the currents $i$ nor $i_5$. Accordingly, the load current $i$ becomes equal to $i_5$, which is regulated to be constant by means of the transistor $T_5$. This means that the regulated load current $i$ is constant and independent of temperature change.

In each of the examples of FIG. 4 and FIG. 5, if a diode is employed in place of the resistor $R_5$ in order to compensate for temperature dependency, the load current $i$ is satisfactorily stabilized.

The invention being thus described, it will be obvious that the same may be varied in many ways. Such variations are not to be regarded as a departure from the spirit and scope of the invention, and all such modifications are intended to be included with the scope of the following claims.

We claim:

1. A constant-current circuit constituted on a monolithic integrated circuit comprising:

a pair of PNP transistors which are constituted adjacent to each other on one monolithic integrated circuit, a pair of NPN transistors which are also constituted adjacent to each other on said monolithic integrated circuit, one of said PNP transistors and one of said NPN transistors being connected to form a first combined transistor circuit, the other one of said PNP transistors and the other one of said NPN transistors being connected to form a second combined transistor circuit, in each combined transistor circuit a collector and an emitter of the PNP transistor being connected to a base and a collector of the NPN transistor, respectively, the base of the PNP transistors being connected to each other;

a third NPN transistor for providing a constant current, the collector of which is connected to the emitter of the NPN transistor of the second combined transistor circuit;

semiconductor means connected to permit currents of the bases of the PNP transistors to flow therethrough; and a DC power source for feeding DC current to said first combined transistor circuit connected in series with a load and for feeding DC current to said second combined transistor circuit connected in series with said third NPN transistor.

2. A constant-current circuit according to claim 1, wherein said semiconductor means is a diode connected between said bases of PNP transistors and the collector of the third NPN transistor.

3. A constant-current circuit according to claim 1, wherein said semiconductor means is a third PNP transistor, the emitter of which is connected to said bases of the first and the second PNP transistors, the base of which is connected to the collector of the third NPN transistor and the collector of which is connected to the emitter of the first NPN transistor of the first combined transistor circuit.

4. A constant-current circuit according to claim 1, wherein said semiconductor means is a circuit including a fourth and a fifth NPN transistor connected in tandem across said power source and at least one diode connected between the bases of the PNP transistors and a tandem connection point between the emitter of the fourth transistor and the collector of the fifth transistor.

5. A constant-current circuit according to claim 1, wherein all of the component semiconductor elements are constituted on one monolithic integrated circuit.

6. A constant-current circuit according to claim 2, wherein all of the component semiconductor elements are constituted on one monolithic integrated circuit.

7. A constant-current circuit according to claim 3, wherein all of the component semiconductor elements are constituted on one monolithic integrated circuit.

8. A constant-current circuit according to claim 4, wherein all the component semiconductor elements are constituted on one monolithic integrated circuit.

9. A constant-current circuit comprising:

a pair of PNP transistors disposed adjacent to one another on a single monolithic integrated circuit;

a pair of NPN transistors disposed adjacent to each other on said monolithic integrated circuit, one of the PNP transistors and one of the NPN transistors of each of said pairs being connected to form first and second combined transistor circuits, each combined transistor circuit having the collector and the emitter of the PNP transistor connected to the base and collector of the NPN transistor, respectively, while the bases of the PNP transistors are connected to each other;

a constant-current source comprising an additional NPN transistor the collector of which is connected to the emitter of the NPN transistor of one of said combined transistor circuits; and a semiconductor switching means connected between the bases of said PNP transistors of said first and second combined transistor circuits and one electrode of said additional NPN transistor.

10. A constant-current circuit according to claim 9, wherein said semiconductor means comprises a diode, the anode of which is connected to the bases of said PNP transistors and the cathode of which is connected to the collector of said additional NPN transistor, and further including a source of DC power coupled across the emitter of said additional NPN transistor and the emitters of said PNP transistors of said first and second combined transistor circuits.

11. A constant-current circuit according to claim 10, wherein the base of said additional NPN transistor is connected to a voltage divider circuit which is connected in parallel with said source of DC power.

12. A constant-current circuit according to claim 9, wherein said semiconductor means comprises an additional PNP transistor, the emitter of which is connected to the bases of said PNP transistors of said first and second combined transistor circuits, the base of said additional PNP transistor being connected to the collector of said additional NPN transistor, and the collector of said additional PNP transistor being connected to the emitter of one of said first and second combined transistor circuits.

13. A constant-current circuit according to claim 11, wherein said semiconductor means comprises a diode, the anode of which is connected to the bases of said PNP transistors and the cathode of which is connected to the collector of said additional NPN transistor, and further including a source of DC power coupled across the emitter of said additional NPN transistor and the emitters of said PNP transistors of said first and second combined transistor circuits.

14. A constant-current circuit according to claim 9, wherein said semiconductor means comprises first and second series connected NPN transistors, coupled across the connection between the emitters of said PNP transistors of said first and second combined transistor circuits, and the emitter of said additional NPN transistor, the base of one of said series connected NPN transistors being connected to the base of said additional NPN transistor, while the base of the other of said series connected NPN transistors is connected to the base of the NPN transistor of one of said first and second combined circuits, and further including a diode means connected between the common connection of said series connected NPN transistors and the bases of said PNP transistors of said first and second combined transistor circuits.

15. A circuit according to claim 13, wherein said semiconductor means comprises a diode, the anode of which is connected to the bases of said PNP transistors and the cathode of which is connected to the collector of said additional NPN transistor, and further including a source of DC power coupled across the emitter of said additional NPN transistor and the emitters of said PNP transistors of said first and second combined transistor circuits.

* * * * *